(12) United States Patent
Kumamoto et al.

(10) Patent No.: US 8,013,671 B2
(45) Date of Patent: Sep. 6, 2011

(54) SEMICONDUCTOR INTEGRATED CIRCUIT

(75) Inventors: Akira Kumamoto, Tokyo (JP);
Tsuyoshi Nishimura, Yokohama (JP);
Chikashi Nakagawara, Yokohama (JP);
Masahiro Tamae, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1 day.

(21) Appl. No.: 12/727,509

(22) Filed: Mar. 19, 2010

(65) Prior Publication Data
US 2011/0063029 A1 Mar. 17, 2011

(30) Foreign Application Priority Data
Sep. 14, 2009 (JP) ................... 2009-212236

(51) Int. Cl.
*H03F 1/02* (2006.01)
(52) U.S. Cl. ................... 330/9; 330/51; 330/302
(58) Field of Classification Search ............ 330/9, 51, 330/302
See application file for complete search history.

(56) References Cited

U.S. PATENT DOCUMENTS

| | | | | |
|---|---|---|---|---|
| 4,495,470 A | * | 1/1985 | Bristol | 330/9 |
| 5,258,664 A | * | 11/1993 | White | 327/91 |
| 5,410,270 A | * | 4/1995 | Rybicki et al. | 330/9 |
| 6,111,467 A | * | 8/2000 | Luo | 330/305 |
| 7,295,143 B2 | * | 11/2007 | Ambo et al. | 341/172 |
| 7,589,587 B2 | * | 9/2009 | Yoshida et al. | 330/9 |
| 7,795,944 B2 | * | 9/2010 | Yagyu et al. | 327/307 |

FOREIGN PATENT DOCUMENTS

JP 2000-252770 9/2000

* cited by examiner

*Primary Examiner* — Patricia Nguyen
(74) *Attorney, Agent, or Firm* — Turocy & Watson, LLP

(57) ABSTRACT

A semiconductor integrated circuit includes a first input terminal configured to input a first input voltage, a second input terminal configured to input a second input voltage, a differential amplifier configured to generate a differential output voltage by amplifying a differential input voltage obtained from a difference between the first input voltage input by the first input terminal and the second input voltage input by the second input terminal, a switch configured to electrically connect or cut off the first input terminal and the second input terminal, and a sample hold unit connected to a power supply which generates a reference voltage and configured to generate an offset correction voltage of the differential amplifier based on the differential output voltage and the reference voltage when the first input terminal and the second input terminal are electrically connected by the switch.

19 Claims, 3 Drawing Sheets

| $V_{IN1}$ or $V_{IN2}$ | N-DMOS 12a | N-DMOS 12b | P-DMOS 12c | P-DMOS 12d |
|---|---|---|---|---|
| (1) HIGHER THAN $V_{TH}$ | OFF | OFF | ON | ON |
| (2) $V_{TH}$ or LOWER | ON | ON | OFF | OFF |

FIG. 3

SEMICONDUCTOR INTEGRATED CIRCUIT

CROSS REFERENCE TO RELATED APPLICATION

This application is based upon and claims the benefit of priority from the prior Japanese Patent Application No. 2009-212236, filed on Sep. 14, 2009, the entire contents of which are incorporated herein by reference.

FIELD

The present invention relates to a semiconductor integrated circuit, and more particularly to a semiconductor integrated circuit including a differential amplifier.

BACKGROUND

Ordinarily, in a semiconductor integrated circuit including a differential amplifier, a N-channel Double Diffused Metal-Oxide-Semiconductor (DMOS) and a P-channel DMOS analog switches are used to correct an offset voltage of a differential amplifier (hereinafter referred to as "offset correction") based on an input voltage.

However, in a conventional semiconductor integrated circuit including a differential amplifier (see JP-A No. 2000-252770 (Kokai)), a signal path during monitoring the input voltage and during the offset correction is switched to perform the offset correction. For example, in a direct current amplifying circuit of JP-A No. 2000-252770 (Kokai), the signal path is short-circuited in order to set the input voltage of the differential amplifier (hereinafter referred to as "differential input voltage") substantially 0 [V]. Thereby, the offset correction is performed.

However, in the conventional semiconductor integrated circuit including the differential amplifier, the DMOS analog switch is directly connected to an input terminal of the differential amplifier. Therefore, when the input voltage is a negative voltage (for example, −2 [V]), a parasitic PN diode is formed between a drain of the N-channel DMOS and a P-channel substrate of the silicon wafer. In this case, the DMOS analog switch does not operate, and accordingly, it is impossible to perform the offset correction of the differential amplifier.

In other words, the conventional semiconductor integrated circuit including the differential amplifier cannot correct the offset of the differential amplifier when the input voltage is a negative voltage.

SUMMARY

According to an aspect of the present invention, there is provided a semiconductor integrated circuit comprising:

a first input terminal configured to input a first input voltage;

a second input terminal configured to input a second input voltage;

a differential amplifier configured to generate a differential output voltage by amplifying a differential input voltage obtained from a difference between the first input voltage input by the first input terminal and the second input voltage input by the second input terminal;

a switch configured to electrically connect or cut off the first input terminal and the second input terminal; and a sample hold unit connected to a power supply which generates a reference voltage and configured to generate an offset correction voltage of the differential amplifier based on the differential output voltage and the reference voltage when the first input terminal and the second input terminal are electrically connected by the switch.

BRIEF DESCRIPTION OF DRAWINGS

FIG. 3 is a chart for illustrating an operation of the controller 13 of FIG. 1.

DETAILED DESCRIPTION

Embodiment will now be explained with reference to the accompanying drawings.

Figure 1:
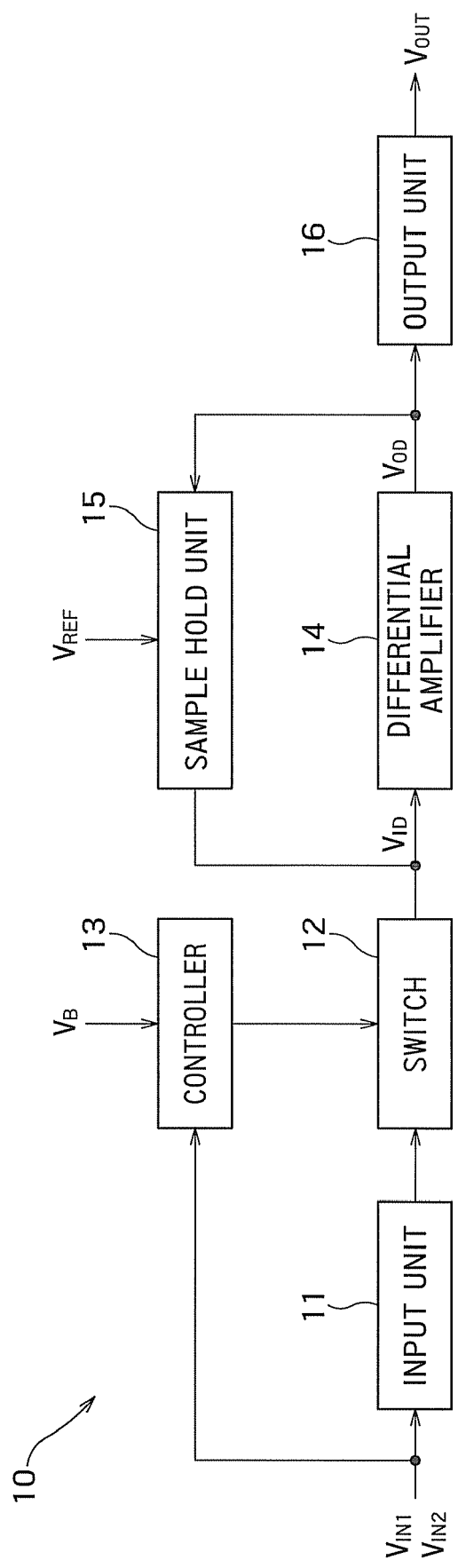
FIG. 1 is a block diagram illustrating the configuration of the semiconductor integrated circuit 10 according to an embodiment of the present invention.

A configuration of a semiconductor integrated circuit 10 according to an embodiment of the present invention will be explained. FIG. 1 is a block diagram illustrating the configuration of the semiconductor integrated circuit 10 according to an embodiment of the present invention.

As illustrated in FIG. 1, the semiconductor integrated circuit 10 includes an input unit 11, a switch 12, a controller 13, a differential amplifier 14, a sample hold unit 15, and an output unit 16.

The input unit of FIG. 1 is configured to input a first input voltage $V_{IN1}$ and a second input voltage $V_{IN2}$ applied by an external circuit (not illustrated). For example, the first input voltage $V_{IN1}$ fulfills an expression, $-2\,[V] < V_{IN1}$. Further, the second input voltage $V_{IN2}$ fulfills an expression, $V_{IN2} < 12\,[V]$.

The switch 12 of FIG. 1 is arranged between the input unit 11 and the differential amplifier 14. The switch 12 is configured to apply a differential input voltage $V_{ID}$ of substantially 0 [V] to the differential amplifier 14 when an offset voltage $V_{OFF}$ of the differential amplifier 14 is to be corrected.

The controller 13 of FIG. 1 is configured to supply a control signal to the switch 12 based on the first input voltage $V_{IN1}$ and the second input voltage $V_{IN2}$, when the offset voltage $V_{OFF}$ of the differential amplifier 14 is to be corrected. Thereby, the offset voltage $V_{OFF}$ of the differential amplifier 14 is corrected. The controller 13 operates based on a drive voltage $V_B$ applied by an external power supply.

The differential amplifier 14 of FIG. 1 is configured to amplify the differential input voltage $V_{ID}$ to generate a differential output voltage $V_{OD}$.

When the switch 12 is ON state (namely, when the offset voltage $V_{OFF}$ of the differential amplifier 14 is to be corrected), the sample hold unit 15 of FIG. 1 is configured to generate an offset correction voltage based on a predetermined reference voltage $V_{REF}$ and the differential output voltage $V_{OD}$ of the differential amplifier 14. When the switch 12 is OFF state, the sample hold unit 15 of FIG. 1 is configured to hold the offset correction voltage. Thereby, the offset voltage $V_{OFF}$ of the differential amplifier 14 is corrected.

The output unit 16 of FIG. 1 is configured to output the differential output voltage $V_{OD}$ generated by the differential amplifier 14, as an output voltage $V_{OUT}$ of the semiconductor integrated circuit 10, to the external circuit.

Figure 2:
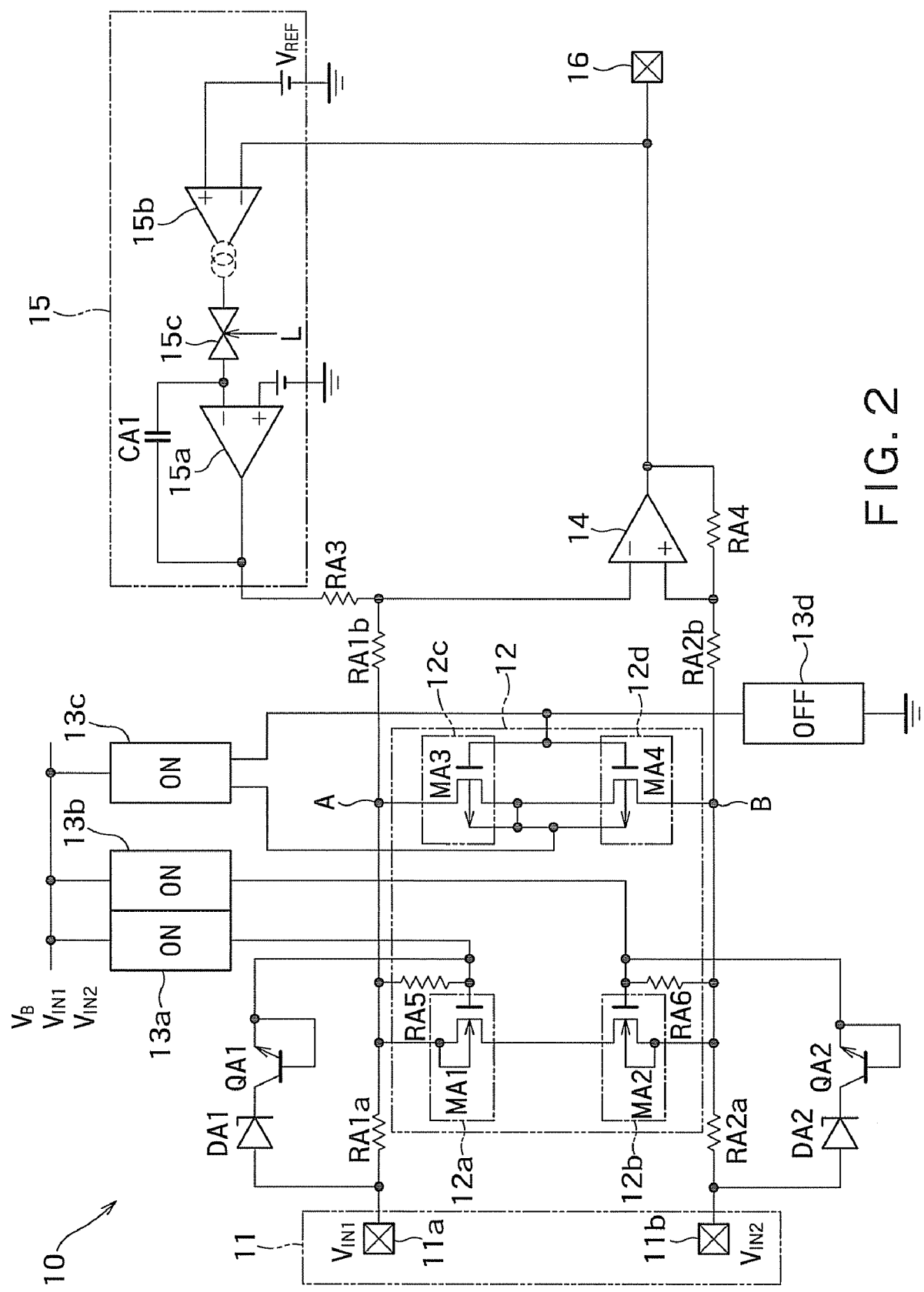
FIG. 2 is a circuit diagram illustrating an example of the semiconductor integrated circuit 10 of FIG. 1.

A specific example of the configuration of the semiconductor integrated circuit 10 will be explained. FIG. 2 is a circuit diagram illustrating an example of the semiconductor integrated circuit 10 of FIG. 1.

As illustrated in FIG. 2, the input unit 11 includes a first input terminal 11a and a second input terminal 11b. The first input terminal 11a is configured to input a first input voltage $V_{IN1}$ applied by the external power supply. The second input terminal 11b is configured to input a second input voltage $V_{IN2}$ applied by the external power supply.

The switch 12 includes N-channel DMOS transistors MA1 and MA2, and P-channel DMOS transistors MA3 and MA4. In other words, the switch 12 is an analog switch constituted by the plurality of DMOS transistors. When the controller 13 applies the control signal to the switch 12 (namely, when the offset voltage $V_{OFF}$ of the differential amplifier 14 is to be corrected), the switch 12 is configured to electrically connect the first input terminal 11a and the second input terminal 11b. Thereby, the differential input voltage $V_{ID}$ of substantially 0 [V] is applied to the differential amplifier 14. Hereinafter, the N-channel DMOS transistor MA1 is referred to as a first N-channel DMOS 12a, the N-channel DMOS transistor MA2 is referred to as a second N-channel DMOS 12b, the P-channel DMOS transistor MA3 is referred to as a first P-channel DMOS 12c, and the P-channel DMOS transistor MA4 is referred to as a second P-channel DMOS 12d.

The controller 13 includes an ON driver 13a for turning on the first N-channel DMOS 12a; an ON driver 13b for turning on the second N-channel DMOS 12b; an ON driver 13c for turning on the first P-channel DMOS 12c and the second P-channel DMOS 12d; and an OFF driver 13d for turning off the first P-channel DMOS 12c and the second P-channel DMOS 12d. Each of the ON drivers 13a to 13c operates based on a predetermined drive voltage $V_B$. The OFF driver 13d is grounded. In other words, the controller 13 is a circuit for controlling the analog switch constituted by the plurality of DMOS transistors. For example, each of the ON drivers 13a to 13c is configured to generate control signals (gate signals) for turning on the first N-channel DMOS 12a, the second N-channel DMOS 12b, the first P-channel DMOS 12c, and the second P-channel DMOS 12d.

The differential amplifier 14 is configured to amplify the differential input voltage $V_{ID}$ obtained from a difference between the first input voltage $V_{IN1}$ input by the first input terminal 11a and the second input voltage $V_{IN2}$ input by the second input terminal 11b to generate the differential output voltage $V_{OD}$. When the switch 12 is OFF state (namely, when the first input terminal 11a and the second input terminal 11b are not electrically connected), the differential input voltage $V_{ID}$ is the difference between the first input voltage $V_{IN1}$ and the second input voltage $V_{IN2}$ ($V_{IN1}-V_{IN2}$). When the switch 12 is ON state (namely, when the first input terminal 11a and the second input terminal 11b are electrically connected), the differential input voltage $V_{ID}$ is substantially 0 [V].

The sample hold unit 15 includes a sample hold amplifier 15a, a Gm amplifier 15b, and a switch 15c. When the switch 12 electrically connects the first input terminal 11a and the second input terminal 11b (namely, when the offset voltage $V_{OFF}$ of the differential amplifier 14 is to be corrected), the sample hold unit 15 is configured to generate, based on the predetermined reference voltage $V_{REF}$ and the differential output voltage $V_{OD}$, the offset correction voltage to be applied to the differential amplifier 14, and sample and hold the offset correction voltage.

The first input terminal 11a is connected to a cathode of a zener diode DA1 and a resister RA1a. An anode of the zener diode DA1 is connected to a collector of an NPN transistor QA1 in which a base and an emitter are short-circuited. A resistor RA5 is connected between a gate and a source of the first N-channel DMOS 12a. The emitter of the NPN transistor QA1 is connected to the gate of the first N-channel DMOS 12a, the resister RA5, and the ON driver 13a. The source of the first N-channel DMOS 12a is connected to a drain of the first P-channel DMOS 12c and a resister RA1b. The resister RA1b is connected to a negative voltage input terminal of the differential amplifier 14 and a resister RA3. The resister RA3 is connected to an output terminal of the sample hold amplifier 15a of the sample hold unit 15. A gate of the first P-channel DMOS 12c is connected to a gate of the second P-channel DMOS 12d, the ON driver 13c, and the OFF driver 13d. A source of the first P-channel DMOS 12c is connected to a source of the second P-channel DMOS 12d and the ON driver 13c.

The second input terminal 11b is connected to a cathode of a zener diode DA2 and a resister RA2a. An anode of the zener diode DA2 is connected to a collector of an NPN transistor QA2 in which a base and an emitter are short-circuited. A resistor RA6 is connected between a gate and a source of the second N-channel DMOS 12b. The emitter of the NPN transistor QA2 is connected to the gate of the second N-channel DMOS 12b, the resister RA6, and the ON driver 13b. The source of the second N-channel DMOS 12b is connected to a drain of the second P-channel DMOS 12d and a resister RA2b. The resister RA2b is connected to a positive voltage input terminal of the differential amplifier 14 and a resister RA4. The resister RA4 is connected to an output terminal of the differential amplifier 14 and a negative voltage input terminal of the Gm amplifier 15b of the sample hold unit 15. The gate of the second P-channel DMOS 12d is connected to the gate of the first P-channel DMOS 12c, the ON driver 13c, and the OFF driver 13d. A source of the second P-channel DMOS 12d is connected to the source of the first P-channel DMOS 12c and the ON driver 13c.

A positive voltage input terminal of the sample hold amplifier 15a is connected to a power supply. A negative voltage input terminal of the sample hold amplifier 15a is connected to a switch 15c configured to turn on based on an output signal L of a logical circuit (not illustrated) generated when the switch 12 turns on (namely, when the offset is to be corrected). The output terminal of the sample hold amplifier 15a is connected to the resister RA3 connected to the negative voltage input terminal of the differential amplifier 14. A capacitor CA1 is connected between the negative voltage input terminal and the output terminal of the sample hold amplifier 15a. For example, the sample hold amplifier 15a performs sampling when the switch 15c is ON state, and performs holding when the switch 15c is OFF state.

A positive voltage input terminal of the Gm amplifier 15b is connected to the power supply supplying the reference voltage $V_{REF}$. The negative voltage input terminal of the Gm amplifier 15b is connected to the output terminal of the differential amplifier 14 and the output unit 16. The output terminal of the Gm amplifier 15b is connected to the switch 15c.

The output terminal 16 is connected to the output terminal of the differential amplifier 14, the resister RA4, and the negative voltage input terminal of the Gm amplifier 15b.

Each of the resistive values of the resisters fulfills expressions, RA1a=RA2a, RA1b=RA2b, RA3=RA4, and RA3=n (RA1a+RA1b). When the above expressions are fulfilled, the differential amplifier 14 achieves a n-times differential operation.

In other words, the switch 12 includes the first P-channel DMOS 12c, the first N-channel DMOS 12a, the second P-channel DMOS 12d, and the second N-channel DMOS 12b. The first P-channel DMOS 12c includes the source connected to a first resister divided node A. The first resister divided node A is connected to the negative voltage input terminal of the differential amplifier 14. The first N-channel DMOS 12a includes a drain is connected to the first resister divided node A. The second P-channel DMOS 12d includes the source connected to a second resister divided node B. The second resister divided node B is connected to the positive voltage input terminal of the differential amplifier 14. The second N-channel DMOS 12b includes a drain connected to the second resister divided node B. The drains of the first P-channel DMOS 12c and the second P-channel DMOS 12d are connected with each other. The first N-channel DMOS 12a and the second N-channel DMOS 12b are connected with each other via the gate and the source thereof.

The offset correction performed by the semiconductor integrated circuit 10 of FIG. 2 will be explained.

In order to perform the offset correction, the controller 13 applies the control signal to the switch 12. When the control signal is supplied, the switch 12 turns on (namely, the first input terminal 11a and the second input terminal 11b are electrically connected). When the switch 12 turns on, the switch 15c turns on (namely, a loop circuit is formed by the differential amplifier 14 and the sample hold unit 15). Since the first input terminal 11a and the second input terminal 11b are electrically connected, the differential input voltage $V_{ID}$ is substantially 0 [V], and the differential output voltage $V_{OD}$ is the offset voltage.

Subsequently, the Gm amplifier 15b amplifies the difference between the differential output voltage $V_{OD}$ and the reference voltage $V_{REF}$, and applies the amplified voltage to the negative voltage input terminal of the sample hold amplifier 15a. Subsequently, the sample hold amplifier 15a amplifies the difference between the predetermined power supply voltage and the output voltage of the Gm amplifier 15b, and outputs the amplified voltage.

The differential output voltage $V_{OD}$ applied to the Gm amplifier 15b varies according to the output voltage of the sample hold amplifier 15a. The switch 15c turns on during the offset correction, and turns off after a predetermined period of time passes.

When the switch 15c turns off, a capacitor CA1 accumulates electric charges corresponding to the output voltage of the sample hold amplifier 15a when the differential output voltage $V_{OD}$ is equal to the reference voltage $V_{REF}$. Since the switch 15c is OFF state, the voltage applied to the resister RA3 connected to the negative voltage input terminal of the differential amplifier 14 is determined based on the electric charges accumulated in the capacitor CA1. In other words, the sample hold unit 15 generates the offset correction voltage corresponding to the output voltage of the sample hold amplifier 15a, holds the offset correction voltage, in order to supply the offset correction voltage to the differential amplifier 14.

An operation of the controller 13 according to the embodiment will be explained. FIG. 3 is a chart for illustrating an operation of the controller 13 of FIG. 1.

<(1) of FIG. 3>

When the first input voltage $V_{IN1}$ or the second input voltage $V_{IN2}$ is larger than a predetermined threshold voltage $V_{TH}$ (for example, half of the power supply voltage), the controller 13 applies the control signal to the switch 12 in such a manner that the first P-channel DMOS 12c and the second P-channel DMOS 12d turn on, and in such a manner that the first N-channel DMOS 12a and the second N-channel DMOS 12b turn off (see (1) of FIG. 3). In this case, the first N-channel DMOS 12a and the second N-channel DMOS 12b are electrically connected, and the first P-channel DMOS 12c and the second P-channel DMOS 12d are electrically connected. As a result, the first input terminal 11a and the second input terminal 11b are electrically connected. Therefore, the differential input voltage $V_{ID}$ of substantially 0 [V] is obtained. In the example of FIG. 2, ON resistances of the first P-channel DMOS 12c and the second P-channel DMOS 12d are prefer- ably made small with respect to the resisters RA1a and RA2a, in view of a maximum value (hereinafter referred to as "maximum input voltage difference") $\Delta V_{MAX}$ of the difference between the first input voltage $V_{IN1}$ and the second input voltage $V_{IN2}$.

<(2) of FIG. 3>

When the first input voltage $V_{IN1}$ or the second input voltage $V_{IN2}$ is equal to or less than the predetermined threshold voltage $V_{TH}$, the controller 13 applies the control signal to the switch 12 in such a manner that the first N-channel DMOS 12a and the second N-channel DMOS 12b turn on, and in such a manner that the first P-channel DMOS 12c and the second P-channel DMOS 12d turn off (see (2) of FIG. 3). In this case, the first P-channel DMOS 12c and the second P-channel DMOS 12d are electrically cut off, and the first N-channel DMOS 12a and the second N-channel DMOS 12b are electrically connected. As a result, the first input terminal 11a and the second input terminal 11b are electrically connected. Therefore, the differential input voltage $V_{ID}$ of substantially 0 [V] is obtained. In the example of FIG. 2, ON resistances of the first N-channel DMOS 12a and the second N-channel DMOS 12b are preferably made small with respect to the resisters RA1a and RA2a, in view of the maximum input voltage difference $\Delta V_{MAX}$.

The threshold voltage $V_{TH}$ is defined to any value within a voltage range in which both of the P-channel DMOS and the N-channel DMOS can operate. When the first input voltage $V_{IN1}$ or the second input voltage $V_{IN2}$ is larger than a predetermined value, the N-channel DMOS cannot operate. When the first input voltage $V_{IN1}$ or the second input voltage $V_{IN2}$ is less than a predetermined value, the P-channel DMOS cannot operate. In other words, when the first input voltage $V_{IN1}$ or the second input voltage $V_{IN2}$ is larger than a predetermined upper limit value, only the P-channel DMOS can operate, and when the first input voltage $V_{IN1}$ or the second input voltage $V_{IN2}$ is less than a predetermined lower limit value, only the N-channel DMOS can operate.

When the first input voltage $V_{IN1}$ or the second input voltage $V_{IN2}$ is larger than the threshold voltage $V_{TH}$, at least the P-channel DMOS can operate. Therefore, the controller 13 applies the control signal to the switch 12 in such a manner that the first P-channel DMOS 12c and the second P-channel DMOS 12d turn on. On the other hand, when the first input voltage $V_{IN1}$ or the second input voltage $V_{IN2}$ is equal to or less than the threshold voltage $V_{TH}$, at least the N-channel DMOS can operate. Therefore, the controller 13 applies the control signal to the switch 12 in such a manner that the first N-channel DMOS 12a and the second N-channel DMOS 12b turn on.

When the first input voltage $V_{IN1}$ or the second input voltage $V_{IN2}$ is between the threshold voltage $V_{TH}$ and the above upper limit value or between the threshold voltage $V_{TH}$ and the above lower limit value, the controller 13 may supply the control signal to the switch 12 in such a manner that both of a pair of the first N-channel DMOS 12a and the second N-channel DMOS 12b and a pair of the first P-channel DMOS 12c and the second P-channel DMOS 12d turn on.

In any of the cases of (1) and (2) of FIG. 3, the differential input voltage $V_{ID}$ of substantially 0 [V] is obtained. Therefore, in any of the cases of (1) and (2) of FIG. 3, the differential output voltage $V_{OD}$ is the offset voltage $V_{OFF}$. Accordingly, regardless of the value of the first input voltage $V_{IN1}$ or the second input voltage $V_{IN2}$, the offset correction can be performed. The sample hold unit 15 uses the sample hold amplifier 15a, the Gm amplifier 15b, and the switch 15c to correct the offset voltage $V_{OFF}$ to a value corresponding to the reference voltage $V_{REF}$, and holds the offset correction voltage. As a result, the offset voltage $V_{OFF}$ of the differential amplifier 14 is corrected.

In the embodiment, the controller 13 may periodically supply the control signal to the switch 12, or supply the control signal to the switch 12 according to an instruction applied by the external circuit.

In other words, in the semiconductor integrated circuit 10 according to the embodiment, the ON state or the OFF state of the switch 12 is controlled according to the magnitude of the first input voltage $V_{IN1}$ or the second input voltage $V_{IN2}$. Therefore, regardless of the value of the first input voltage $V_{IN1}$ or the second input voltage $V_{IN2}$, the offset of the differential amplifier 14 can be appropriately corrected, and the offset correction voltage is held.

In the embodiment, the drains of the first N-channel DMOS 12a and the second N-channel DMOS 12b are connected with each other in series, the source of the first N-channel DMOS 12a is connected to the first resister divided node A, and the source of the second N-channel DMOS 12b is connected to the second resister divided node B. The sources of the first P-channel DMOS 12c and the second P-channel DMOS 12d are connected with each other in series, the drain of the first P-channel DMOS 12c is connected to the first resister divided node A, and the drain of the second P-channel DMOS 12d is connected to the second resister divided node B. The drain of the first N-channel DMOS 12a and the source of the first P-channel DMOS 12c are electrically connected. The drain of the second N-channel DMOS 12b and the source of the second P-channel DMOS 12d are electrically connected. Therefore, when the first input voltage $V_{IN1}$ or the second input voltage $V_{IN2}$ is a negative voltage, the parasitic PN diode is formed between the P-channel substrate of the silicon wafer and the drains of the first N-channel DMOS 12a and the second N-channel DMOS 12b. In the embodiment, however, the first resister divided node A and the second resister divided node B are also electrically connected. Therefore, even when the parasitic PN diode turns on, the offset correction of the differential amplifier 14 is adverse affected.

Further, in the embodiment, during a normal operation in which the differential amplifier 14 amplifies the difference (differential input voltage) between the first input voltage $V_{IN1}$ and the second input voltage $V_{IN2}$, the analog switch of the switch 12 turns off. As a result, at the first resister divided node A and the second resister divided node B, the parasitic PN diode is not formed between the P-channel substrate of the silicon wafer and the drains of the first N-channel DMOS 12a and the second N-channel DMOS 12b, even when the first input voltage $V_{IN1}$ or the second input voltage $V_{IN2}$ is a negative voltage. Therefore, the differential amplifier 14 operates normally even when the first input voltage $V_{IN1}$ or the second input voltage $V_{IN2}$ is a negative voltage.

In the embodiment, an element added to protect the gate of the DMOS also preferably has such properties that prevent formation of the parasitic PN diode between the element and the P-channel substrate of the silicon wafer. In this case, the drive voltage $V_B$ of the controller 13 can be ensured by selectively using the analog switches according to the value of the first input voltage $V_{IN1}$ or the second input voltage $V_{IN2}$.

In the embodiment, a resistance value of the resister RA1a to the input resisters (RA1a+RA2a) preferably has the smallest value within a voltage range in which the drive voltage $V_B$ can be ensured. During the offset correction of the differential amplifier 14, since the first resister divided node A and the second resister divided node B are electrically connected, the resister RA1a and resister RA2a form a loop not to be corrected. As a result, a relative error between the resister RA1a and resister RA2a remains as an offset correction error. However, due to the reasons described above, this offset correction error can be reduced when the resistance value of the resister RA1a to the input resisters has the smallest value.

In other words, in the semiconductor integrated circuit 10, the differential input voltage $V_{ID}$ is set to be substantially 0 [V]. Therefore, the output voltage $V_{OSH}$ of the sample hold unit 15 is corrected to the value corresponding to the reference voltage $V_{REF}$, and the corrected output voltage $V_{OSH}$ is held (namely, the offset voltage $V_{OFF}$ of the differential amplifier 14 is corrected). Thereupon, the differential amplifier 14 operates.

In the example of the embodiment, an example in which the switch 12 includes the first N-channel DMOS 12a, the second N-channel DMOS 12b, the first P-channel DMOS 12c, and the second P-channel DMOS 12d has been explained. However, the scope of the present invention is not limited thereto. In another embodiment of the present invention, the switch 12 may be arranged at least one pair of MOS transistors between the input unit 11 and the differential amplifier 14. In this case, the controller 13 controls ON/OFF switching of at least one pair of MOS transistors. In other words, the switch 12 may be arranged with one pair of N-channel DMOSs.

According to the embodiment, the signal path of the switch 12 arranged between the input unit 11 and the differential amplifier 14 is switched according to the relationship of the magnitudes between the first input voltage $V_{IN1}$ or the second input voltage $V_{IN2}$ and the predetermined threshold voltage $V_{TH}$, so that the differential input voltage $V_{ID}$ is reduced, and the reduced differential input voltage $V_{ID}$ is used in the offset correction. Therefore, even when the first input voltage $V_{IN1}$ or the second input voltage $V_{IN2}$ is a negative value, the differential amplifier can operate.

According to the embodiment, the switch 12 has at least one pair of MOSs (for example, N-channel DMOSs). Therefore, the differential input voltage $V_{ID}$ can be greatly reduced.

According to the embodiment, the switch 12 includes not only the N-channel DMOSs which can operate even when the first input voltage $V_{IN1}$ or the second input voltage $V_{IN2}$ is low, but also the P-channel DMOSs which can operate even when the first input voltage $V_{IN1}$ or the second input voltage $V_{IN2}$ is high. Therefore, an input dynamic range of the differential amplifier 14 can be ensured.

According to the embodiment, the controller 13 selectively uses the N-channel DMOS and the P-channel DMOS according to the relationship of the magnitudes between the first input voltage $V_{IN1}$ or the second input voltage $V_{IN2}$ and the predetermined threshold voltage $V_{TH}$. Therefore, the drive current generated based on the drive voltage $V_B$ can be less than that of a case where the controller 13 controls the switch 12 to turn on both of the N-channel DMOS and the P-channel DMOS at the same time.

In the embodiment, an example in which the controller 13 selectively uses the N-channel DMOS and the P-channel DMOS according to the relationship of the magnitudes between the first input voltage $V_{IN1}$ or the second input voltage $V_{IN2}$ and the predetermined threshold voltage $V_{TH}$ has been explained. However, the scope of the present invention is not limited thereto. In still another embodiment of the present invention, the controller 13 may control the switch 12 to turn on both of the N-channel DMOS and the P-channel DMOS at the same time during the offset correction. In this case, only the N-channel DMOS turns on when the first input voltage $V_{IN1}$ or the second input voltage $V_{IN2}$ is higher than a predetermined value, and only the P-channel DMOS turns on when the first input voltage $V_{IN1}$ or the second input voltage $V_{IN2}$ is less than the predetermined value.

According to the embodiment, the resistance value of the resistance RA1$a$ to the input resisters (RA1$a$+RA2$a$), which is connected to the first input terminal 11$a$, is reduced. Therefore, the offset correction error can be reduced. For example, the analog switch of the switch 12 is preferably arranged at the position as closely to the input unit 11 as possible.

It should be understood that the above embodiments are merely examples and are not considered to be restrictive. The technical scope of the present invention is described by the claims. The technical scope is intended to include meanings equivalent to the claims and all changes and modifications within the claims.

The invention claimed is:

1. A semiconductor integrated circuit comprising:
   a first input terminal configured to input a first input voltage;
   a second input terminal configured to input a second input voltage;
   a differential amplifier configured to generate a differential output voltage by amplifying a differential input voltage obtained from a difference between the first input voltage input by the first input terminal and the second input voltage input by the second input terminal;
   a switch configured to electrically connect or cut off the first input terminal and the second input terminal; and
   a sample hold unit connected to a power supply which generates a reference voltage and configured to generate an offset correction voltage of the differential amplifier based on the differential output voltage and the reference voltage when the first input terminal and the second input terminal are electrically connected by the switch.

2. The circuit of claim 1, further comprising a controller configured to supply a control signal to electrically connect the first input terminal and the second input terminal to the switch, wherein
   the switch is configured to electrically connect the first input terminal and the second input terminal when the control signal is supplied from the controller.

3. The circuit of claim 2, wherein
   the switch comprises at least a P-channel DMOS (Double-Diffused Metal Oxide Semiconductor), and
   the controller is configured to supply the control signal to switch ON/OFF of the P-channel DMOS to the switch.

4. The circuit of claim 3, wherein
   the switch further comprises a N-channel DMOS connected in parallel to the P-channel DMOS, and
   the controller is configured to further supply the control signal to switch ON/OFF of the N-channel DMOS to the switch.

5. The circuit of claim 4, wherein when the control signal is supplied to the switch, the controller is configured to compare the first input voltage or the second input voltage with a predetermined threshold voltage and to supply the control signal based on a compared result to the switch.

6. The circuit of claim 5, wherein the controller is configured to supply the control signal to the switch in such a manner that the P-channel DMOS turns on when the first input voltage or the second input voltage is larger than the threshold voltage and that the N-channel DMOS turns on when the first input voltage or the second input voltage is equal to or less than the threshold voltage.

7. The circuit of claim 5, wherein the threshold voltage is within a voltage range in which both of the P-channel DMOS and the N-channel DMOS operate.

8. The circuit of claim 4, wherein when the control signal is supplied from the controller, the N-channel DMOS and the P-channel DMOS electrically connect the first input terminal and the second input terminal.

9. The circuit of claim 4, wherein at least one of the N-channel DMOS and the P-channel DMOS electrically connects the first input terminal and the second input terminal when the control signal is supplied from the controller.

10. The circuit of claim 2, wherein
    the switch comprises:
       a first P-channel DMOS having a drain connected to a first resister divided node connected to a negative voltage input terminal of the differential amplifier; and
       a second P-channel DMOS having a drain connected to a second resister divided node connected to a positive voltage input terminal of the differential amplifier, and
    the controller generates the control signal to switch ON/OFF of the first P-channel DMOS and the second P-channel DMOS.

11. The circuit of claim 10, wherein
    the switch further comprises:
       a first N-channel DMOS having a source connected to the first resister divided node; and
       a second N-channel DMOS having a source connected to the second resister divided node, and
    the controller generates the control signal to switch ON/OFF of the first N-channel DMOS and the second N-channel DMOS.

12. The circuit of claim 11, wherein
    the drain of the first N-channel DMOS and the drain of the second N-channel DMOS are connected with each other,
    a gate of the first P-channel DMOS is connected to the source of the second P-channel DMOS, and
    a source of the first P-channel DMOS is connected to a gate and of the second P-channel DMOS.

13. The circuit of claim 11, wherein when the control signal is supplied to the switch, the controller is configured to compare the first input voltage or the second input voltage with a predetermined threshold voltage, and to supply the control signal to switch ON/OFF of the first P-channel DMOS, the second P-channel DMOS, the first N-channel DMOS, and the second N-channel DMOS based on a compared result to the switch.

14. The circuit of claim 13, wherein the controller is configured to supply the control signal to the switch in such a manner that the first P-channel DMOS and the second P-channel DMOS turn on when the first input voltage or the second input voltage is larger than the threshold voltage, and to generate the control signal in such a manner that the first N-channel DMOS and the second N-channel DMOS turn on when the first input voltage or the second input voltage is equal to or less than the threshold voltage.

15. The circuit of claim 13, wherein the threshold voltage is within a voltage range in which all of the first P-channel DMOS, the second P-channel DMOS, the first N-channel DMOS, and the second N-channel DMOS operate.

16. The circuit of claim 11, wherein when the control signal is supplied to the switch, the controller is configured to supply the control signal to turn on at least one pair of a pair of the first P-channel DMOS and the second P-channel DMOS and a pair of the first N-channel DMOS and the second N-channel DMOS turns on.

17. The circuit of claim 2, wherein the sample hold unit comprises:
    a Gm amplifier connected to the power supply and configured to amplify a difference between the differential output voltage and the reference voltage when the controller supplies the control signal to the switch;
a sample hold amplifier configured to amplify a difference between an output voltage of the Gm amplifier and a predetermined power supply voltage, and
a capacitor configured to accumulate electric charges corresponding to an output voltage of the sample hold amplifier.

18. The circuit of claim 17, wherein the capacitor is configured to accumulate the electric charges corresponding to the offset correction voltage.

19. The circuit of claim 2, wherein the controller is configured to periodically supply the control signal to the switch.

* * * * *